United States Patent
Han et al.

(10) Patent No.: US 7,554,335 B2
(45) Date of Patent: Jun. 30, 2009

(54) PRODUCTION TEST TECHNIQUE FOR RF CIRCUITS USING EMBEDDED TEST SENSORS

(75) Inventors: Donghoon Han, Alpharetta, GA (US); Abhijit Chatterjee, Atlanta, GA (US)

(73) Assignee: Georgia Tech Research Corporation, Atlanta, GA (US)

(*) Notice: Subject to any disclaimer, the term of this patent is extended or adjusted under 35 U.S.C. 154(b) by 309 days.

(21) Appl. No.: 11/436,309

(22) Filed: May 18, 2006

(65) Prior Publication Data

US 2007/0033474 A1    Feb. 8, 2007

Related U.S. Application Data

(60) Provisional application No. 60/696,201, filed on Jul. 1, 2005.

(51) Int. Cl.
*G01R 31/02* (2006.01)
(52) U.S. Cl. ...................... 324/537; 324/763
(58) Field of Classification Search ............. 324/537, 324/763
See application file for complete search history.

(56) References Cited

U.S. PATENT DOCUMENTS 7,006,939 B2 *   2/2006   Voorakaranam et al. .... 702/117

* cited by examiner

*Primary Examiner*—Amy He
(74) *Attorney, Agent, or Firm*—Merchant & Gould

(57) ABSTRACT

A single test stimulus and a simple test configuration with embedded envelope detectors are used to estimate all the specification values of interest for an RF circuit under test in an integrated circuit chip. Envelope detectors are deployed as sensors inside the circuit under test. Where more than one circuit is in an RF device in the integrated circuit, each RF circuit in the device may have its own envelope detector. A signal having, for example, time-varying envelopes is used as an optimized test stimulus. The test uses the time-varying and low frequency envelope of the test response. The circuit's response under test to the optimized test stimulus has features highly correlated with the specifications of interest. The test stimulus is optimized for a set of training circuits, and each training circuit in the set is selected to provide one of a spectrum of test responses to the stimulus.

19 Claims, 4 Drawing Sheets

PRODUCTION TEST TECHNIQUE FOR RF CIRCUITS USING EMBEDDED TEST SENSORS

RELATED APPLICATIONS

This patent application is based on Provisional Patent Application Ser. No. 60/696,201, filed Jul. 1, 2005, entitled Low Cost Production Test Technique of RF Circuits Using Envelope Detector, and claims the benefit of the filing date of the provisional patent application.

TECHNICAL FIELD

The invention relates to testing radio frequency (RF) circuits and systems, and more particularly to testing the circuits and systems with a testing technique making use of embedded test sensors.

BACKGROUND OF THE INVENTION

Advances in semiconductor manufacturing technology during the last decade have enabled integration of wireless transceiver systems into a single chip and provided low cost, system-level solutions. As the manufacturing cost has been reduced, production test cost has become an increasingly larger portion of the total manufacturing cost. In conventional test approaches, the specifications of the radio frequency (RF) system under test are measured and compared to predefined test bounds to determine pass/fail for the system. Each specification measurement involves stimulating the DUT with a different test stimulus under a different test circuit configuration. In addition, due to the high operating frequency involved, production test of RF circuits requires the use of expensive measurement systems and elaborate measurement setups. These issues associated with RF circuit production test increase RF test cost and thereby increase the overall manufacturing cost of high frequency RF devices.

Another problem area for a wireless system under test is diagnosis of component circuits making up the system since the ability to do failure diagnosis is important for design debugging and rapid yield ramp-up with new silicon technologies. However, in a highly integrated RF transceiver with multiple sub-modules, failure diagnosis is difficult due to the infeasibility of probing internal RF nodes.

Some methods of RF testing using embedded test sensors have been tried in the past. In one case, the method required long test time and had difficulty handling multiple parametric faults. In other cases, the methods did not take into account the effect of internal stimulus changes by the performance metrics of submodules. Further, the tests required multiple embedded test sensors to extract various specification features, and therefore, the sensors used too much die area and were susceptible to failure. Such failures degrade the manufacturing yield.

SUMMARY OF THE INVENTION

In accordance with the present invention, the above and other problems are solved by using a single test stimulus and a simple test configuration with embedded envelope detectors to estimate all the specification values of interest. Envelope detectors are deployed as sensors inside the RF device under test. Each RF circuit in the device may have its own envelope detector. A signal with time-varying envelopes such as an amplitude-modulated (AM) signal is used as the test stimulus. The test makes use of the time-varying and low frequency envelope of the test response of the circuit under test. The response of the circuit under test to the test stimulus has features highly correlated with the specifications of interest. The test stimulus is optimized for a set of training circuits, where each training circuit in the set is selected so that a set of response by the circuits provides a spectrum of test responses to the optimized stimulus. Non-linear regression-based models are built from a set of specification values from a standard test of the circuits and a set of envelopes of the test response signals of the circuits during the optimized stimulus test. The non-linear regression-models are used thereafter to predict specification values of a circuit from the circuit's envelope signal response to the optimized stimulus.

In another aspect of the invention, a test structure for a system under test has a plurality of circuits to be tested for faults. The system under test and the plurality of circuits under test are integrated into the same circuit chip. A test sensor for each circuit under test is also integrated into the same circuit chip. This sensor detects the test response of its circuit. An apply module applies an optimized stimulus to a circuit under test in the system. A predict module predicts the specification of the circuit under test from the test response of the circuit under test to the optimized stimulus in order to detect a parametric fault in the circuit under test.

The advantages of the present invention are at least three-fold. First, it is possible to predict multiple transceiver and (embedded) module specifications with a single test. Even though a low speed digitizer (attached to the transceiver DSP) is used to process the signals, the predicted specifications are at-speed test specification values. Second, the test technique requires much smaller test time without expensive measurement equipment as compared to standard tests for RF systems and circuits. Third, accurate diagnosis of sub-module specifications is possible even when there are simultaneous performance perturbations in multiple modules. These and various other features as well as advantages, which characterize the present invention, will be apparent from a reading of the following detailed description and a review of the associated drawings.

DETAILED DESCRIPTION OF THE INVENTION

In the preferred embodiments of the invention, a built-in self test technique is implemented for extracting specifications of circuits and systems for wireless transceivers. With minimal external tester support, high quality built-in testing is performed with significant reduction of overall test time. The technique consists of deploying test sensors (envelope detectors) embedded inside the system and measuring the envelope of the output signal of the circuit responding to a single, optimized test stimulus. The envelope of the test response signal of the RF circuit is a relatively low frequency signal compared to the nominal operating frequency of the RF circuit under test, and can therefore be easily sampled using low-sampling-rate analog-to-digital converters. The output of the embedded sensor is highly correlated with the specifications of the circuit under test. Based on the test sensor output signals, the target specifications for individual modules as well as the system can be predicted with very high degree of accuracy.

Figure 1:
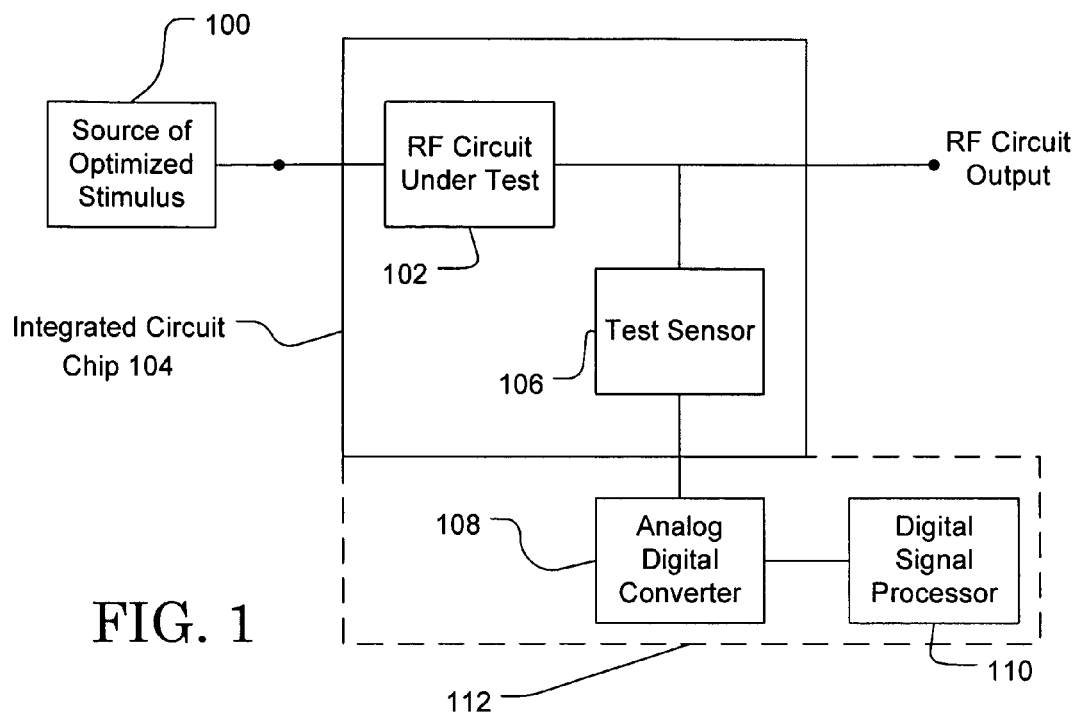
FIG. 1 shows the test structure for an integrated circuit under test with an embedded test sensor.

FIG. 1 illustrates the simple test structure in one preferred embodiment of the invention. In this test structure, a circuit 102 is being tested, and a test sensor 106 is embedded in the same integrated circuit 104 with the circuit 102. An optimized test stimulus is applied by a test stimulus source 100 at the input of the circuit 102 under test. Test sensor 106 is connected to the RF output of circuit 102 and generates a signal representative of the test response of circuit 102 to the optimized stimulus. This test sensor signal is digitized by analog-to-digital converter (ADC) 108 and passed to digital signal processor 110. The integrated circuit chip 104 may also include the ADC 108 and the digital signal processor 110 as represented in FIG. 1 by the dashed line 112.

Figure 2:
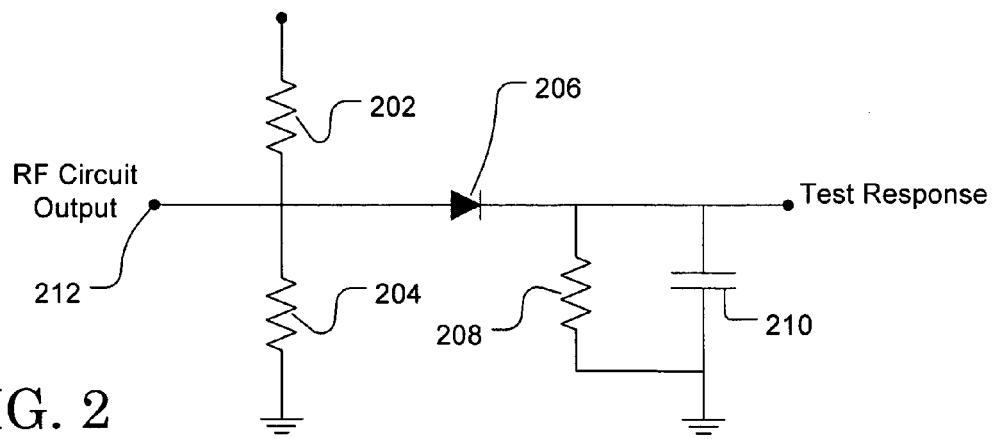
FIG. 2 shows an example of a test sensor implemented as an envelope detector.

The test sensor 106 of FIG. 1 can be a simple envelope detector circuit as for example shown in FIG. 2. Resistors 202 and 204 are bias resistors for the diode 206 and RC time constant circuit made up of resistor 208 and capacitor 210. The RF output of the circuit 102 (FIG. 1) is monitored at the input node 212 of the envelope detector in FIG. 2. Diode 206 and resistor 208 and capacitor 210 are selected to extract the envelope of the RF output signal from circuit under test. One advantage of the envelope detector is its simplicity and its resultant very small die area on an integrated circuit chip.

The optimized stimulus applied to the circuit under test in one preferred embodiment is an amplitude modulated signal. In an RF environment, the carrier frequency is in the order of Gigahertz and the amplitude modulation signal is in the order of 100 Kilohertz. It is essential that the embedded test sensor have low sensitivity to process variations. The envelope detector performance is determined by the RC time constant of the envelope detector. The envelope detector filters out the RF signals while passing the envelope signal. The value of the RC time constant can be set to be $fo<<1/(2*\pi*RC)<<fc$, where fo is the frequency of the envelope, and fc is the carrier frequency. Considering that the frequencies fo and fc have large separation, the RC time constant can be picked to make the decoded envelope signal less sensitive to process variations relating to the RC values respectively of resistor 208 and capacitor 210. In addition diode 206 acts as a switch. Assuming that both the small signal resistance and the parasitic capacitance of the diode are much smaller than the values of R and C, the performance variations in the diode will have little or no impact on the overall performance of the envelope detector.

The input impedance of the envelope detector depends mainly on the bias resistors and the capacitance of the diode. The bias resistors 202, 204 are relatively large compared to the typical 50 ohm RF circuit matching impedance. During the normal operating mode, the bias voltage +Vb to the envelope detector can be turned off thereby deactivating the envelope detector. In this case, the diode behaves like an open switch. Moreover, the input capacitance of a diode can be adjusted to be several tens of femto-Farads by optimal circuit sizing. Therefore, the input impedance of the envelope detector has negligible effect (loading) on the RF output of the circuit under test.

Figure 3:
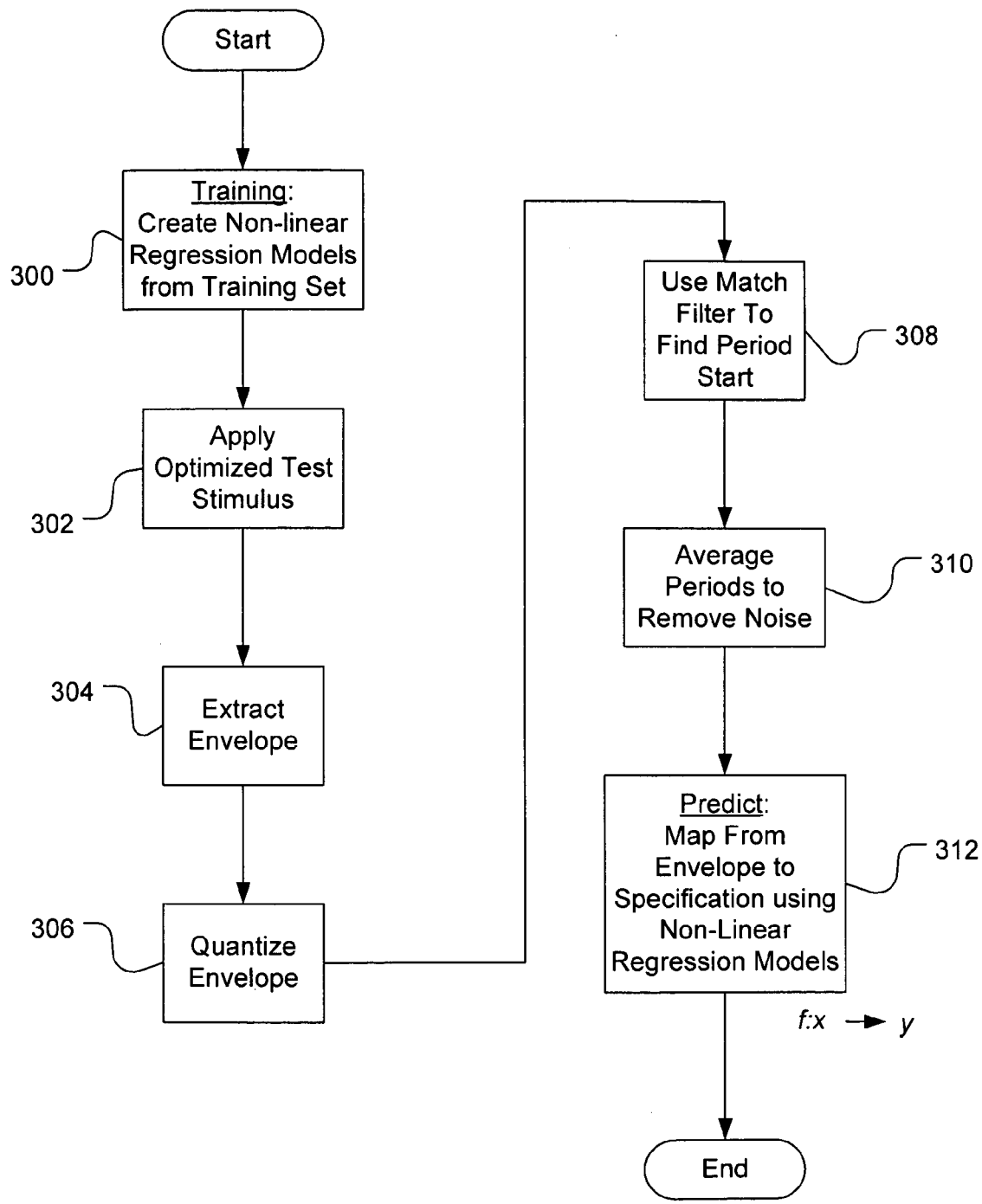
FIG. 3 shows the operational flow for production testing of integrated circuits while making use of an optimized stimulus and non-linear regression models to predict the specification of the circuit under test.

FIG. 3 shows the logical operations of a preferred embodiment of the invention performing the test technique to measure the specification of a production circuit under test. The logical operations of the various embodiments of the present invention are implemented (1) as a sequence of computer implemented acts or program modules running on a computing system and/or (2) as interconnected machine logic circuits or circuit modules. The implementation is a matter of choice dependent on the performance requirements of the system implementing the invention. Accordingly, the logical operations making up the embodiments of the present invention described herein are referred to variously as operations, structural devices, acts or modules. It will be recognized by one skilled in the art that these operations, structural devices, acts and modules may be implemented in software, in firmware, in special purpose digital logic, and any combination thereof without deviating from the spirit and scope of the present invention as recited within the claims attached hereto.

Figure 4:
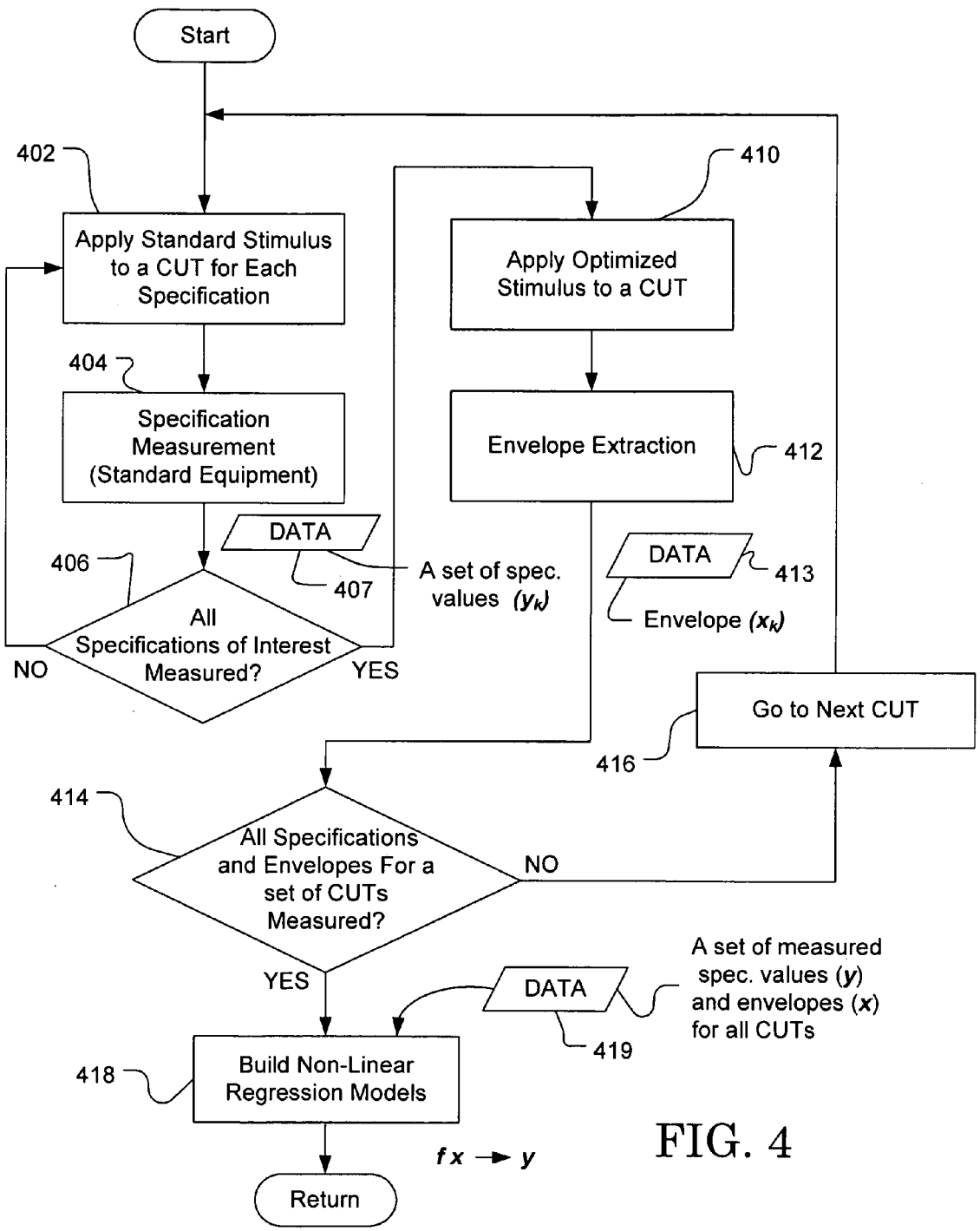
FIG. 4 shows the operational flow for training module 300 in FIG. 3 which creates non-linear regression models for use in the predict module 312 in FIG. 3.

In FIG. 3 the logical operations begin at training module 300. Training module 300 creates non-linear regression models by testing a training set of circuits of the same type as the circuit under test. In the training module a set of specification values from test responses to a standard test procedure and a set of envelopes from test responses to an optimized stimulus test procedure are collected for each circuit in the training set of circuits. The non-linear regression models are created from the set of specification values and the set of envelopes for the circuits in the training set. The training module is illustrated in FIG. 4 and described hereinafter with reference to FIG. 4.

In FIG. 3 apply optimized stimulus operation 302 applies an optimized stimulus to the circuit under test in the production test operational flow of FIG. 3. The test stimulus needs to be optimized in such a way that the envelope detector output has information relating to the circuit under test performance metrics. The optimized stimulus is the same stimulus selected to properly exercise the training set of circuits under test in FIG. 4 when creating the non-linear regression models. The non-linear regression models are used to map the envelope detected for the circuit under test to the specification for that circuit, thereby measuring the specification of the circuit under test.

When the optimized test stimulus is applied to the circuit under test, the test response of the circuit is detected by extract envelope operation 304. This operation is performed by a test sensor such as the envelope detector of FIG. 2. The envelope signal extracted from the test response by the envelope detector is digitized or quantized by quantize envelope operation 306, i.e. an analog-to-digital operation. The envelope of the test response signal is usually a low frequency signal which can be easily quantized by an on-chip low-sampling-rate ADC and processed by a program running in a digital signal processor. For example in one preferred embodiment, a two-tone sinusoidal signal is selected as the optimized stimulus. This stimulus has a time-varying envelope and can be easily implemented on a load board or obtained through an RF signal generator. The fundamental frequency of the envelope is the difference between the two-tone signal frequencies. By controlling these two frequencies, the frequency of the obtained envelope can be adjusted in such a way that it is suitable for sampling by the quantize envelope operation 306.

Filter operation 308 uses a match filter to find a periodic starting point in the envelope signal. The envelope of the RF test response signal is sampled in the presence of noise. This noise comes from internal thermal noise of the devices, ground bounce and other board level noise and quantization noise of the ADCs. The averaging operation 310 averages periodic portions of the envelope to remove the noise. First, the transient envelope signal is sampled during multiple periods and time averaged. Then, one period of the envelope is extracted as the final input parameter for the predict module 312.

Predict module 312 uses the non-linear regression models built in FIG. 4 (described hereinafter) to map from the test response envelope of the circuit under test to the measured specification of the circuit under test. This mapping with the non-linear regression models achieves external RF equipment level accuracy for RF circuit tests.

The training module for creating the non-linear regression models is shown in FIG. 4. To create the non-linear regression models, first a training set of circuits under test is selected and tested with a standard stimulus using standard measurement configurations to measure specification values for each circuit in the training set. Second, the training set of circuits is tested by applying an optimized stimulus and extracting the envelope signals of the test responses of each circuit in the training set. A set of envelopes is collected for the training set of circuits. The specification values data set and the envelope data set are used to build the non-linear regression models for mapping between envelope data and specification values.

The circuits under test selected for the training set are chosen to provide test responses across a spectrum of responses possible for the circuit. Likewise the optimized stimulus for the test is selected to produce responses that will correlate well with the specifications values being measured. For the given set of specification variations, Monte-Carlo simulation using behavioral models is performed to extract the envelopes of test response for a set of circuits under test. Then, a non-linear regression model is built to map the envelopes into the specification of a training set. The performance of the model is evaluated through calculating the difference between actual specification and the extracted specification. Finally, the value of the difference drives the optimization engine to find the optimum or quasi-optimum stimulus. With behavioral models for RF circuits, optimal diagnostic stimulus can be more readily obtained. However, due to the limitation of the exact modeling of RF circuits, a difference between the hardware and simulation results is expected. To reduce this difference, a fine tuning of the stimuli needs to be done through the hardware measurements.

The training module operations shown in FIG. 4 begin at apply standard stimulus operation 402. Operation 402 sets a standard test configuration and applies a standard test stimulus to a circuit under test (CUT) for a given specification to be measured. Measurement operation 404 measures the response to the standard test stimulus and collects the measured specification value $Y_k$ for circuit "k" in data set 407. All specifications test operation 406 detects if all specifications have been measured for circuit "k". If there are more specifications to be measured, the operation flow branches NO and returns to apply standard test stimulus operation 402. The operation flow remains in operation loop 408 until all specifications for the circuit "k" have been measured. When all of the specifications have been measured, the operation flow branches YES to apply optimized stimulus operation 410.

Apply optimized stimulus operation 410 sets the optimized test configuration for the same circuit "k" just tested using the standard test technique. The optimized test configuration for the optimized stimulus test is set by enabling the test sensor, i.e. providing power to the envelope detector, and by initializing the optimized stimulus test process in the digital signal processor. Optimized stimulus operation 410 then applies the optimized stimulus to the circuit under test. Extraction operation 412 detects the envelope of the test response to the optimized stimulus and collects the envelope data $X_k$ for circuit "k" in a data set 413. All CUTs (circuits under test) test operation 414 detects whether the circuit just tested is the last circuit in the training set. If the circuit is not the last circuit in the training set, the operation flow branches NO to next CUT operation 416. Next CUT operation identifies the next circuit under test in the training set and returns the operational flow to apply standard test operation 402.

When all CUTs test operation 414 detects the last circuit in the training set has been tested, the operation flow branches YES to build models operation 418. Build models operation 418 receives the data set 419 which contains a set of measured specification values Y and a set of envelopes X for the circuits under test in the training set. With this data the build models operation 418 builds non-linear regression models that can be used to map from envelope data to specification values. The models are used in predict operation 312 (FIG. 3) during optimized stimulus testing of production circuits to measure the specifications of those circuits. The building of non-linear regression models may be accomplished by using MARS (Multivariate Adaptive Regression Splines). Alternatively another technique for building non-linear regression models is RBF (Radial Basis Functions).

Figure 5:
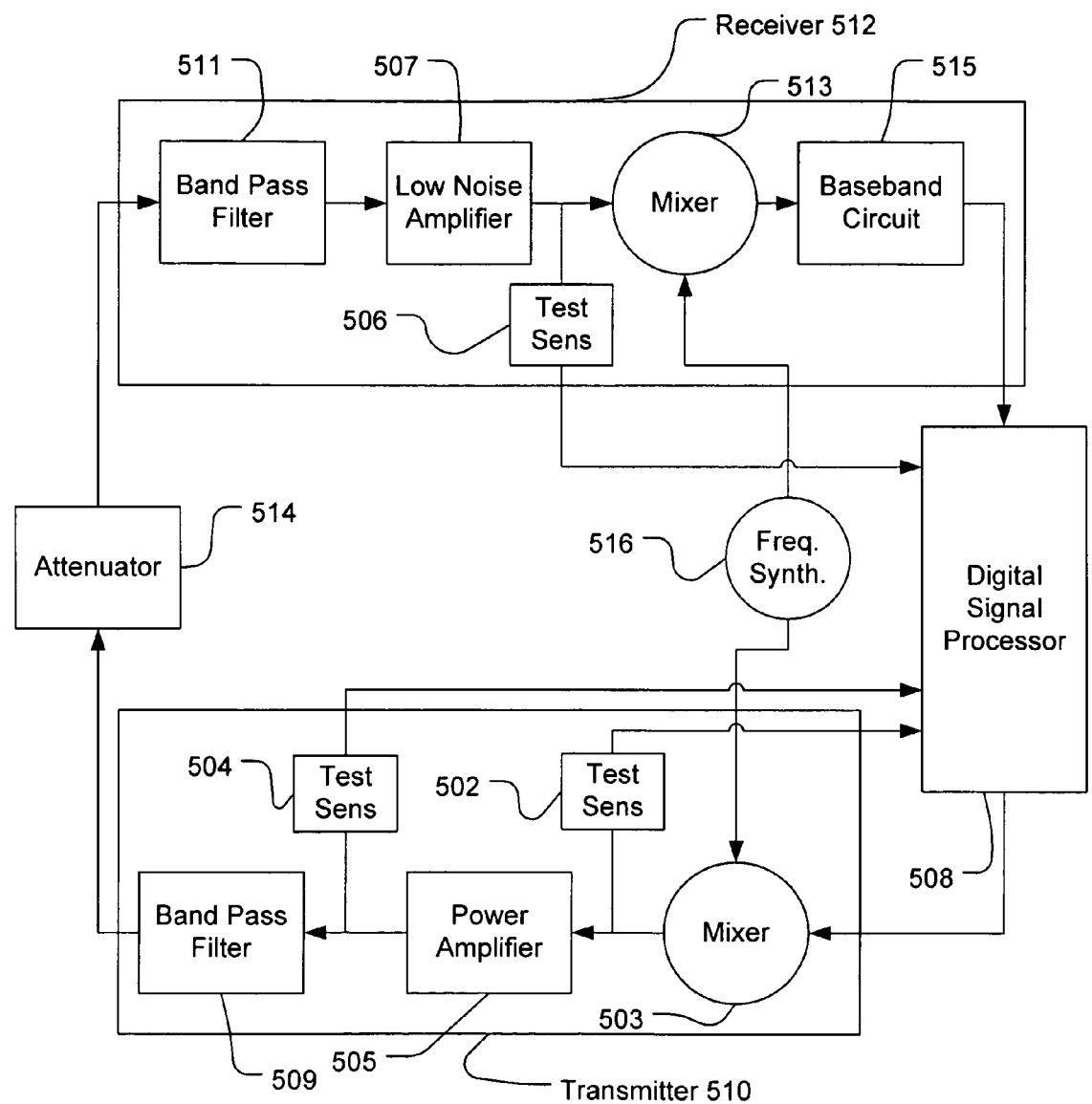
FIG. 5 shows the test structure for detecting faults in circuits under test in an RF transceiver on an integrated circuit chip.

FIG. 5 illustrates a test structure for an RF transceiver on an integrated circuit chip with multiple embedded envelope detectors to measure specifications of circuits embedded in the chip. The transmitter 510 of the RF transceiver has mixer 503, power amplifier 505 and band pass filter 509. Loop-back mode is employed to feed the transmitter output signal to the receiver 512 thereby eliminating the need of RF signal generators to test the receiver 512. In this mode, an attenuator 514 is deployed in the load board to adjust the signal power fed to the receiver 512. The receiver 512 includes band pass filter 511, low noise amplifier 507, mixer 513 and baseband circuit 515. Frequency synthesizer 516 provides the carrier frequency for the mixers in the transmitter and receiver.

The objective is to measure the specification values of sub-components (circuits) to determine any parametric faults. Test sensors 502, 504 and 506 are deployed at the output node of mixer 503, power amplifier 505 and low noise amplifier 507 respectively. The test response outputs of these embedded circuits can be observed through their associated, embedded test sensors. An optimized test stimulus can be applied from the digital signal processor (DSP) 508. The digital signal processor 508 can perform an analog-to-digital conversion (ADC) and a digital-to-analog conversion (DAC) as well as process the test responses. Further, the ADC, the DAC and the DSP may all be placed on the same integrated circuit chip with the transmitter 510 and receiver 512 if so designed.

To test mixer 503, its input is controllable and not affected by other components so the test response detected by test sensor 502 is directly associated with the specifications for the mixer. On the other hand, the power amplifier 505 receives its input from the mixer 503 and therefore its input is not controllable for it alone and its output is affected by the performance of both the mixer 503 and the power amplifier 505. However, the test response of the mixer as detected from test sensor 502 can be used to compensate the test response detected by test sensor 504 for variations caused by the mixer. This compensation would be done using non-linear regression mapping, as described above, on both test responses for sensors 502 and 504. The same procedure is extended to the following LNA circuit testing in the loop-back mode. Further the test sensors may be envelope detectors and the stimulus applied may be optimized as described above.

While the invention has been particularly shown and described with reference to preferred embodiments thereof, it will be understood by those skilled in the art that various other changes in the form and details may be made therein without departing from the spirit and scope of the invention.

What is claimed is:

1. A testing system for testing a circuit in an integrated circuit, the system comprising;

a test sensor embedded on an integrated circuit chip with a circuit under test on the integrated circuit chip, wherein the test sensor comprises an envelope detector circuit operative to detect an envelope signal inputted to the test sensor from an output of the circuit under test;

a source of an optimized stimulus operative to apply the optimized stimulus to the circuit under test, wherein the optimized stimulus is a radio frequency (RF) signal with a time-varying envelope;

the test sensor being operative to detect, from the circuit under test, a test response to the optimized stimulus; and a prediction module predicting a measured specification for the circuit under test from the test response.

2. The testing system of claim 1, further comprising:
an analog-to-digital converter for digitizing the test response for processing by the prediction module.

3. The testing system of claim 1, further comprising:
an analog-to-digital converter for digitizing the envelope signal for processing by the prediction module.

4. The testing system of claim 3, wherein the analog-to-digital converter is embedded in the integrated circuit chip with the circuit under test and the envelope detector circuit.

5. The testing system of claim 3, wherein the prediction module uses non-linear regression models to map the envelope signal digitized by the analog-to-digital converter to measured specification values for the circuit under test.

6. The system of claim 1, wherein the test sensor being operative to detect, from the circuit under test, the test response to the optimized stimulus comprises the test sensor being operative to detect, from the circuit under test, the test response by employing the envelope detector circuit to:
filter out an RF signal outputted from the circuit under test, and
pass the time-varying envelope signal.

7. The system of claim 1, wherein the envelope circuit comprises at least one resistor, a capacitor, and a diode.

8. A method for testing a circuit in an integrated circuit chip, the method comprising:
applying an optimized stimulus to a circuit under test in the integrated circuit chip wherein the optimized stimulus is a radio frequency (RF) signal with a time-varying envelope;
extracting an envelope signal from a test response by the circuit under test to the optimized stimulus, wherein extracting the envelope signal from the test response by the circuit under test to the optimized stimulus comprises extracting, by an envelope detector circuit, the envelop signal inputted to the envelope detector circuit from an output of the circuit under test; and
predicting a specification measurement of the circuit under test from the envelope signal.

9. The method of claim 8, further comprising:
quantizing the envelope signal to sample the envelope signal and convert the envelope signal to digital envelope data.

10. The method of claim 9, wherein predicting the specification measurement of the circuit under test from the envelope signal comprises predicting the specification measurement of the circuit under test from the digital envelope data obtained from the envelope signal.

11. The method of claim 8, further comprising:
quantizing the envelope signal to sample the envelope signal and convert the envelope signal to digital envelope data;
filtering the digital envelope data with a match filter to find the start of an envelope period in the envelope data; and
averaging envelope periods of the envelope data to remove noise from the digital envelope data.

12. The method of claim 11, wherein predicting the specification measurement of the circuit under test from the envelope signal comprises predicting the specification measurement of the circuit under test from the digital envelope data substantially free of noise.

13. The method of claim 8, further comprising:
creating non-linear regression models for a training set of circuits under test from a set of specification values resulting from standard stimuli and from a set of envelopes resulting from the optimized stimulus.

14. The method of claim 13, wherein creating non-linear regression models for a training set of circuits under test comprises:
applying a standard stimulus test to each training circuit from the training set of circuits under test and measuring a specification value for the response of each training circuit to the standard stimulus; and
applying an optimized stimulus test to each training circuit from the training set of circuits under test and extracting the envelope signal of the test response of each training circuit to the optimized stimulus.

15. The method of claim 14, wherein creating non-linear regression models for a training set of circuits under test further comprises:
collecting measured specification values for each training circuit of the circuits under test into the set of specification values;
collecting extracted envelopes for each training circuit of the circuits under test into the set of envelopes.

16. The method of claim 15, further comprising:
building non-linear regression models from the set of specification values and from the set of envelopes.

17. The method of claim 16, further comprising mapping, into the measured specification values for the circuit under test, the envelope extracted from the optimized stimulus test.

18. The method of claim 8, wherein extracting the envelope signal from the test response by the circuit under test to the optimized stimulus further comprises employing the envelope detector circuit to:
filter out an RF signal outputted from the circuit under test, and
pass the time-varying envelope signal.

19. A testing system for testing a circuit in an integrated circuit, the system comprising;
a test sensor embedded on an integrated circuit chip with a circuit under test on the integrated circuit chip, wherein the test sensor comprises an envelope detector circuit operative to detect a time-varying envelope signal inputted to the test sensor from an output of the circuit under test, the envelope detector comprising: a diode, at least one resistor, and a capacitor;
a source of an optimized stimulus operative to apply the optimized stimulus to the circuit under test, wherein the optimized stimulus is a radio frequency (RF) signal with a time-varying envelope;
the test sensor being operative to detect, from the circuit under test, a test response to the optimized stimulus, wherein the test sensor being operative to detect, from the circuit under test, the test response to the optimized stimulus comprises the test sensor being operative to detect, from the circuit under test, the test response by employing the envelope detector circuit to:
filter out an RF signal outputted from the circuit under test, and
pass the time-varying envelope signal; and
a prediction module predicting a measured specification from the test response.

* * * * *